United States Patent [19]

Suda et al.

[11] 4,400,674
[45] Aug. 23, 1983

[54] COIL UNIT

[75] Inventors: Takayuki Suda, Kisakata; Koichi Yasuda, Nishime, both of Japan

[73] Assignee: TDK Electronics Co., Ltd., Tokyo, Japan

[21] Appl. No.: 185,526

[22] Filed: Sep. 9, 1980

[30] Foreign Application Priority Data

Apr. 22, 1980 [JP] Japan .................................. 55-53925

[51] Int. Cl.³ ...................... H01F 15/02; H01F 15/10
[52] U.S. Cl. ............................................ 336/65; 336/83;
336/192; 336/200; 336/212; 361/401
[58] Field of Search ................... 336/83, 65, 200, 212,
336/192, 98, 216; 361/401

[56] References Cited

U.S. PATENT DOCUMENTS

| 1,641,473 | 9/1927 | Chylinski | 336/83 X |
| 1,775,600 | 9/1930 | Reis | 336/98 X |
| 3,273,134 | 9/1966 | Lemaire et al. | 336/65 X |
| 3,381,251 | 4/1968 | Fuller | 336/83 |
| 3,593,217 | 7/1971 | Weber | 336/65 X |
| 3,750,069 | 7/1973 | Renskers | 336/83 |
| 4,314,221 | 2/1982 | Satou et al. | 336/83 |

FOREIGN PATENT DOCUMENTS 55-117220  9/1980  Japan .................................. 336/216

Primary Examiner—Thomas J. Kozma
Attorney, Agent, or Firm—Robert Scobey

[57] ABSTRACT

A coil unit formed of a coil-wound inner core partially circumferentially encased by an outer core. The coil unit is mounted on a plate with the outer core externally exposed and covering the lead-in wires to the coil which are adhered to contacts on the plate.

7 Claims, 11 Drawing Figures

COIL UNIT

BACKGROUND AND BRIEF DESCRIPTION OF THE INVENTION

This invention relates to a small-sized coil unit, and has particular application to such a unit used for thin meters, such as watches.

An example of a known, conventional coil unit used for the same purposes is assembled by oppositely fitting on a coil (from both ends) a pair of outer cores each of which integrally consists of an axially projecting bobbin core, a bottom disk, and outer cores having two notches. The lead-in wires of the coil are led through the notches.

Such a known coil unit occupies a greater vertical space, since it is assembled into a cylindrical form by abutting a pair of pot-shaped cores in the axial direction, and then mounting them uprightly on a mounting or base plate. The mounted unit has impeded the reduction of the size of meters which employ such a coil unit because of its size. For instance, in the manufacture of wrist watches requiring a reduction in the thickness of the watch and extremely small inductors, such a conventional coil unit is unsatisfactory. The conventional coil unit also has the disadvantage that, in connecting the lead-in wires to external terminals or a printed circuit, the wires have to be wound around the terminals or printed circuit prior to soldering. Further, connecting the lead-in wires to external terminals requires intricate and difficult procedures, such as preparatory soldering, to secure reliable soldering. There is also the possibility that the lead-in wires may be damaged or cut during transportation, since they are externally exposed.

Accordingly, an object of the present invention is to provide an extremely small-sized coil unit which is ideal for use as an ultrasmall inductor and which overcomes the above disadvantages. This object is achieved through use of a coil unit formed of a coil-wound inner core partially circumferentially encased by an outer core. The coil unit is preferably mounted on a plate with the outer core externally exposed and covering the lead-in wires to the coil which are adhered to contacts on the plate.

The invention will be more completely understood by referring to the following detailed description.

DETAILED DESCRIPTION

Figure 1:
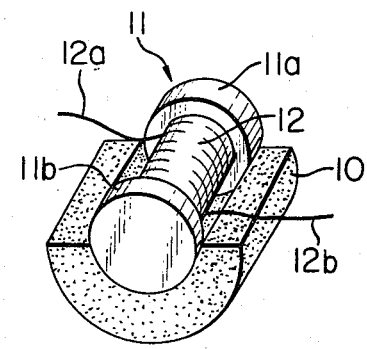
FIG. 1 is a perspective view of a coil unit embodying the present invention.

Referring to FIG. 1, illustrating in perspective a coil unit embodying the present invention, the coil unit is constituted of a substantially semicylindrical outer core 10 (a half cylinder, as shown) and a drum-shaped bobbin core or inner core 11 provided with flanges 11a and 11b on respective ends and having a coil 12 wound on the bobbin part thereof. The outer core 10 and the bobbin core 11 have virtually the same length. The bobbin core 11 is fitted inside of the outer core 10 and fixed at the flanges 11a and 11b by an adhesive. The bottom half of the coil 12 wound on the bobbin core 11 is enclosed by the outer core 11 and the upper half thereof is exposed. Thus the inner core 11 is partially circumferentially encased by the outer core 10. Lead-in wires 12a and 12b of the coil 12 are led outside along flat surfaces of the outer core 10. In this embodiment, the outer core 10 and the bobbin core 11 are made of a material having a relatively high specific resistance, such as a ferrite of the Ni-Zn group, and the area in section of the magnetic path of the outer core 10 and the bobbin core 11 are practically the same.

Figure 2:
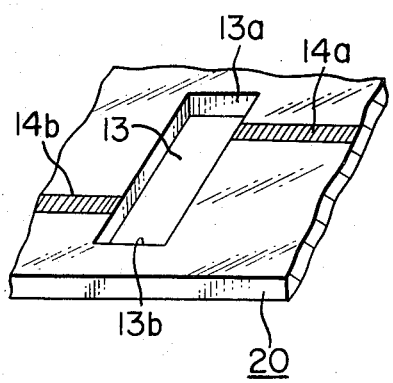
FIGS. 2 and 3 are perspective views of examples of circuit plates for mounting the coil unit of FIG. 1.
Figure 3:
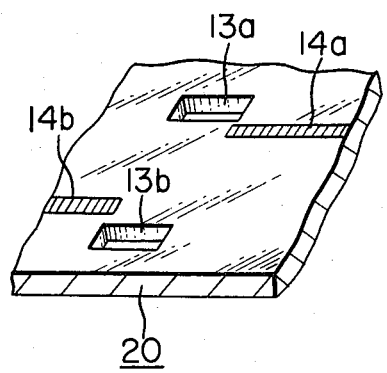
Figure 4:
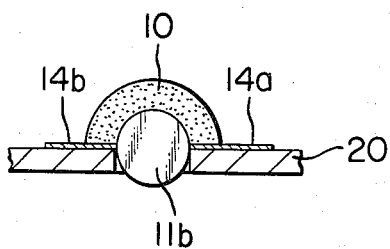
FIG. 4 is a sectional view illustrating the coil unit of FIG. 1 mounted on the circuit plate of FIG. 2.

Referring to FIGS. 2 and 3, the coil unit of FIG. 1 is mounted on a circuit plate 20 (e.g., a printed circuit plate or ceramic plate), as shown. The circuit plate 20 of FIG. 2 is suitably provided with a rectangular hole 13 having a width approximately the same as the diameter of the flanges 11a and 11b of the bobbin core 11, and includes a pair of printed circuit patterns 14a and 14b at positions adjacent to the lead-in wires 12a and 12b. The coil unit is mounted on the circuit plate 20 with its exposed half (the half not encased by the outer core 10) inserted into the rectangular hole 13 and the lead-in wires 12a and 12b touching the circuit patterns 14a and 14b, respectively, as shown in FIG. 4. Then the coil unit and the circuit plate 20 are fixed together by brazing along the contact line between the edges of the outer core 10 and the circuit plate 20, and the circuit patterns and the lead-in wires 12a and 12b. The circuit plate 20 of FIG. 3 is provided with a pair of mounting holes 13a and 13b at positions corresponding to the flanges 11a and 11b; the coil unit is mounted on this circuit plate with the exposed or non-encased half of the coil 12 adjacent to the circuit plate and a part of each of the flanges 11a and 11b fitted into the holes 13a and 13b, respectively.

Thus a coil unit in accordance with the present invention is extremely small. When mounted on a circuit plate, the coil unit typically protrudes above the surface of that plate only for a distance corresponding to the radius of the semicylindrical outer core, thereby occupying less vertical space relative to a conventional coil unit. Accordingly, a coil unit according to the present invention is ideal for inductors for wrist watches of reduced thickness. Furthermore, such a coil unit has a high inductance practically the same as that of a conventional coil unit, since the combination of the outer core and the bobbin core forms a closed magnetic path, the coil is uniformly wound on the bobbin part of the bobbin core, and areas in section of the outer core and the bobbin part of the bobbin core are practically the same so that leakage flux is satisfactorily absorbed. According to tests that have been performed, more than 95% of leakage flux were absorbed by a coil unit according to the present invention. Regarding assembling of a coil unit, while a conventional coil unit is assembled by abutting a pair of pot-shaped cores, the coil unit of the present invention is assembled by simply fitting the flanges of the bobbin core on the inner periphery of the semicylindrical outer core. Thus a coil unit embodying the present invention is simple in construction and easy to assemble and manufacture. Still further, the coil unit of the present invention can be provided for users as inexpensive tip-type inductors. Furthermore, the coil unit of the present invention greatly facilitates its mounting on a circuit plate of the type shown in FIGS. 2 and 3.

Figure 5:
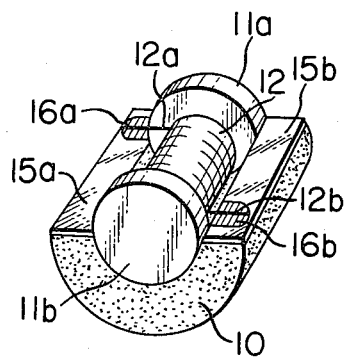
FIG. 5 is a perspective view of another coil unit embodying the invention.

Referring now to FIG. 5, showing a modification, the lead-in wire 12a and 12b are brazed with brazing alloy 16a and 16b to electrode layers 15a and 15b prepared by attaching silver foil or copper plates onto the flat surfaces of the semicylindrical outer core 10. In mounting such a coil unit on a circuit plate 20 as illustrated in FIG. 2, the coil unit is fitted onto the circuit plate with its non-encased half fitted into the rectangular hole 13 and the electrode layers 15a and 15b in contact with corresponding circuit patterns 14a and 14b, and then fixed to the circuit plate 20 by brazing along the edges of the electrode layers as illustrated in FIG. 6.

Figure 6:
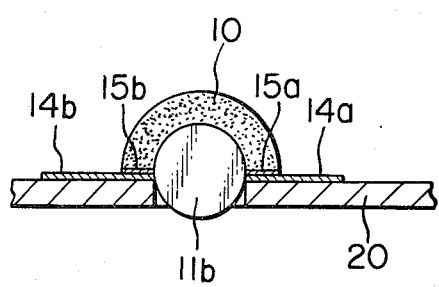
FIG. 6 is a sectional view illustrating the mounting of the coil unit of FIG. 5 on a circuit plate.

In addition to the advantages of the coil unit of FIGS. 1-4 as hereinbefore described, a coil unit of the type of FIGS. 5 and 6 has the advantages that extra terminals or lead-in wires are not required, and connection of the coil unit and the circuit is facilitated as the lead-in wires are fixed onto the electrodes formed on the flat surfaces of the semicylindrical outer core 10. There is thus a lesser possibility of damaging the lead-in wires, mounting the coil unit on the circuit plate is greatly facilitated, and the circuit pattern design is subject to less limiting conditions.

Figure 7:
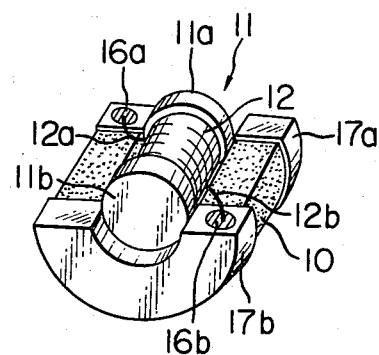
FIG. 7 is a perspective view of still another coil unit embodying the invention.
Figure 8:
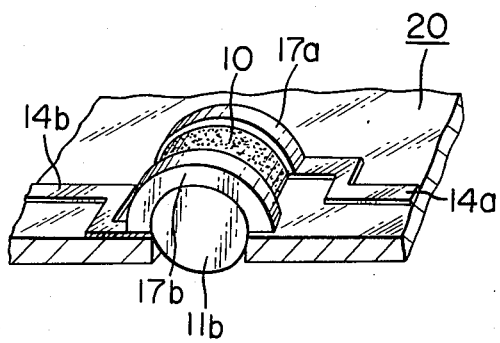
FIG. 8 is a perspective view illustrating the mounting of the coil unit of FIG. 7 on a circuit plate.

In another embodiment of the present invention as shown in FIG. 7, the length of the semicylindrical outer core 10 is slightly longer than that of the bobbin core 11. Metallic caps 17a and 17b, such as copper caps, are provided for the extending ends of the semicylindrical outer core 10. The lead-in wires 12a and 12b are fixed to the metallic caps 17a and 17b by an adhesive 16a and 16b. In mounting this coil unit onto the circuit plate 20, the flanges 11a and 11b are fitted into the hole 13 on the circuit plate, with the metallic caps in contact with the corresponding circuit patterns 14a and 14b as illustrated in FIG. 8, and the coil unit and the circuit plate 20 are fixed together in the same manner as described hereinbefore.

This embodiment has the same advantages as the unit shown in FIG. 5. In addition, the electrode constructing efficiency is further improved, since the electrodes are constructed only by simply placing electrode caps onto the extending ends of the semicylindrical outer core (as compared with the silver foil or copper plate electrodes described in connection with FIG. 5).

Figure 9:
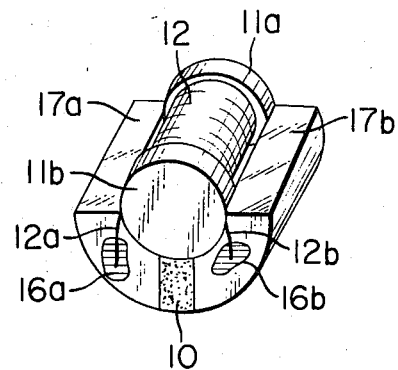
FIG. 9 is a perspective view of yet another coil unit embodying the invention.
Figure 10:
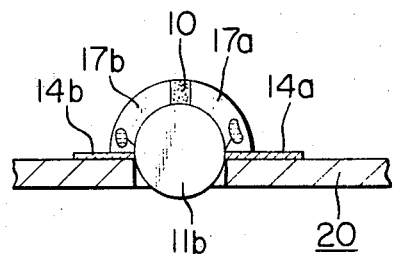
FIGS. 10 and 11 are side views, partly sectional, illustrating the mounting of the coil unit of FIG. 9 on circuit plates.
Figure 11:
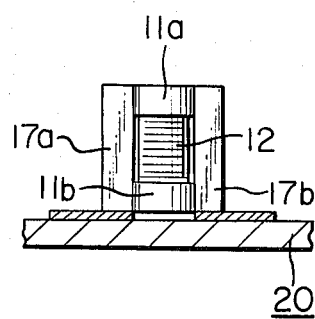

Referring to FIG. 9 illustrating another embodiment, metallic caps 17a and 17b may be placed on the semicylindrical outer core 10 symmetrically on the right and left halves and the lead-in wires 12a and 12b may be brazed to one end face of these respective electrode caps as at 16a and 16b. This coil unit also can be mounted on a circuit plate in the same manner as described hereinbefore, i.e., as shown in FIG. 10. When a narrow circuit plate 20 is used, this coil unit may be mounted upright on the circuit plate 20, as shown in FIG. 11. Such a mounting results in less horizontal space being occupied by the coil unit.

Although all embodiments have been described as provided with a semicylindrical outer core, an outer core having another cross-section may be employed. For example, a part of a circle smaller than a half circle may be employed, so that the flanges of the bobbin core can be inserted deeper into the mounting hole, thus reducing the vertical space occupied by the coil unit when it is mounted on the circuit plate. Further, a concavity may be formed on the circuit plate for mounting the coil unit instead of a rectangular hole.

It will be obvious to those skilled in the art from what has been described above that the present invention is capable of providing an extremely small coil unit which is ideal for use as an ultrasmall inductor.

While the above described embodiments represent preferred forms of the present invention, it is to be understood that modifications will occur to those skilled in the art (besides those specifically noted above) without departing from the spirit of the invention. The invention thus should be taken as defined by the following claims.

We claim:

1. A coil unit comprising an outer core in the form of about a half cylinder, and a drum-shaped bobbin core provided with a flange on each end thereof and having a coil wound thereon, said outer core and said bobbin core being assembled with a part of the outer periphery of said flanges fixed to the inner periphery of said outer core and with the outer core encasing the bobbin core for only about one-half the circumference of said bobbin core, the remainder of said bobbin core being non-encased.

2. A coil unit as set forth in claim 1, wherein electrode plates are provided on said outer core.

3. A coil unit as set forth in claim 1, wherein metallic caps are provided on said outer core.

4. A coil unit comprising an outer core and an inner core, said inner core having a coil wound thereon, and said outer core being positioned against and partially circumferentially encasing said coil-wound inner core for only about one-half the circumference of said inner core, the remainder of said coil-wound inner core being non-encased.

5. A coil unit as set forth in claim 4, in combination with a mounting plate having an opening therein into which said non-encased part of said coil-wound inner core is positioned.

6. A coil unit as set forth in claim 4, wherein said inner core includes a flange on each end thereof, and in combination with a mounting plate having one or more openings therein into which said flanges are positioned.

7. A coil unit as set forth in claim 5 or 6, wherein said mounting plate includes electrodes thereon electrically connected to said coil and positioned beneath said outer core.

* * * * *